(12) United States Patent
Hirama

(10) Patent No.: US 9,589,501 B2
(45) Date of Patent: *Mar. 7, 2017

(54) DISPLAY DRIVE CIRCUIT INCLUDING AN OUTPUT TERMINAL

(71) Applicant: LAPIS Semiconductor Co., Ltd., Yokohama (JP)

(72) Inventor: Atsushi Hirama, Chiba (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/932,118

(22) Filed: Nov. 4, 2015

(65) Prior Publication Data

US 2016/0055795 A1 Feb. 25, 2016

Related U.S. Application Data

(60) Continuation of application No. 14/190,495, filed on Feb. 26, 2014, now Pat. No. 9,208,716, which is a
(Continued)

(30) Foreign Application Priority Data

Dec. 15, 2006 (JP) .................................. 2006-337902

(51) Int. Cl.
*G06F 3/038* (2013.01)
*G09G 3/32* (2016.01)
(Continued)

(52) U.S. Cl.
CPC ......... *G09G 3/3225* (2013.01); *G09G 3/3208* (2013.01); *G09G 3/3266* (2013.01);
(Continued)

(58) Field of Classification Search
CPC ... G09G 3/30; G09G 5/00; G09G 3/10; G06F 3/038; G02F 1/133; G05F 1/00; G05F 1/10; G05F 1/40; H02J 3/12
(Continued)

(56) References Cited

U.S. PATENT DOCUMENTS 6,396,308 B1  5/2002  Bosnyak et al.
6,600,472 B1  7/2003  Nakai et al.
(Continued)

FOREIGN PATENT DOCUMENTS

JP  2002-151276 A  5/2002
JP  2003-131617 A  5/2003
(Continued)

*Primary Examiner* — Pegeman Karimi
(74) *Attorney, Agent, or Firm* — Rabin & Berdo, P.C.

(57) ABSTRACT

A display drive circuit formed in a chip manufactured by a chip on glass implementation, which is connected to lead lines formed on a glass substrate, includes a rectangularly-shaped substrate, a power supply line formed on the substrate, the line being elongated along the longer side of the rectangular shaped substrate, a plurality of output terminals formed on the rectangular shaped substrate, the output terminal being disposed along the power supply line, a plurality of bump electrodes, each of which connects one of the output terminal to one of the lead lines, switches disposed along the power supply line, each of which is connected between the one of the output terminals and the power supply line, a single power supply terminal, which is disposed near the middle of the power supply line, being connected to the power supply line.

17 Claims, 6 Drawing Sheets

Related U.S. Application Data division of application No. 11/907,200, filed on Oct. 10, 2007, now abandoned.

(51) Int. Cl.
*H01L 21/768* (2006.01)
*H01L 27/32* (2006.01)

(52) U.S. Cl.
CPC ..... *G09G 3/3275* (2013.01); *H01L 21/76897* (2013.01); *H01L 27/3279* (2013.01); *G09G 3/3216* (2013.01); *G09G 2300/0408* (2013.01); *G09G 2300/0426* (2013.01); *G09G 2320/0223* (2013.01); *G09G 2320/0233* (2013.01); *G09G 2330/021* (2013.01); *H01L 2224/0557* (2013.01); *H01L 2224/05573* (2013.01); *H01L 2224/16* (2013.01); *H01L 2224/17154* (2013.01); *H01L 2924/00014* (2013.01); *H01L 2924/01079* (2013.01); *H01L 2924/12044* (2013.01); *H01L 2924/19043* (2013.01); *H01L 2924/3011* (2013.01)

(58) Field of Classification Search
USPC .......................................... 345/80, 211, 212
See application file for complete search history.

(56) References Cited

U.S. PATENT DOCUMENTS

| | | | |
|---|---|---|---|
| 6,650,308 B2* | 11/2003 | Kawashima | G09G 3/3216 315/169.3 |
| 2002/0101179 A1* | 8/2002 | Kawashima | G09G 3/3216 315/169.3 |
| 2005/0236673 A1 | 10/2005 | Woo et al. | |
| 2006/0066514 A1* | 3/2006 | Kim | G09G 3/296 345/60 |
| 2007/0210722 A1* | 9/2007 | Konno | H05B 33/0803 315/185 S |

FOREIGN PATENT DOCUMENTS

| | | |
|---|---|---|
| JP | 2004-046124 A | 2/2004 |
| JP | 2004-206056 A | 7/2004 |
| JP | 2004-361722 A | 12/2004 |
| JP | 2005-144685 A | 6/2005 |

* cited by examiner

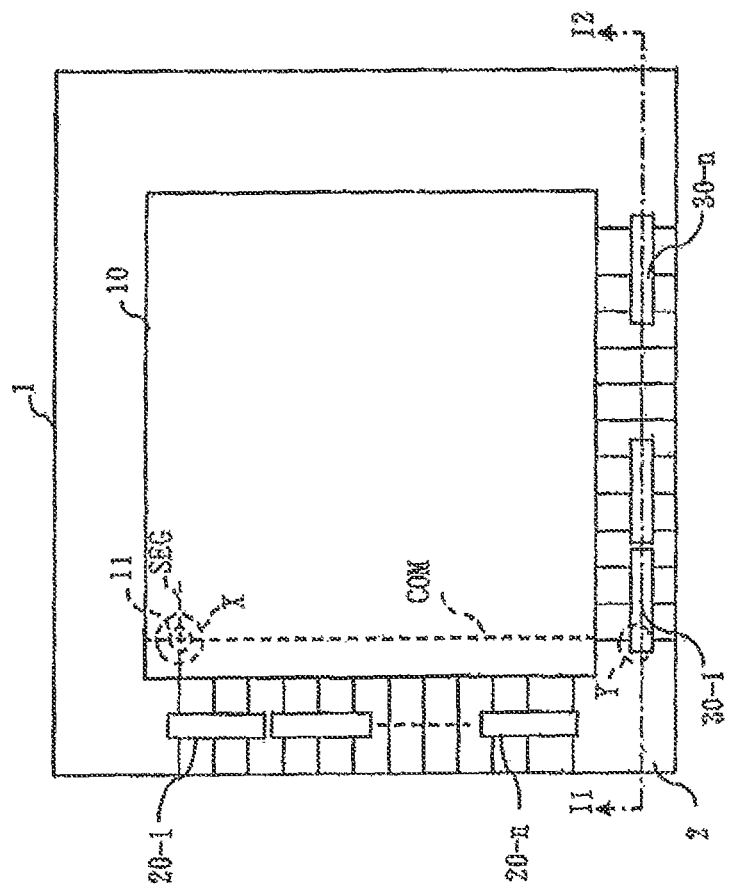
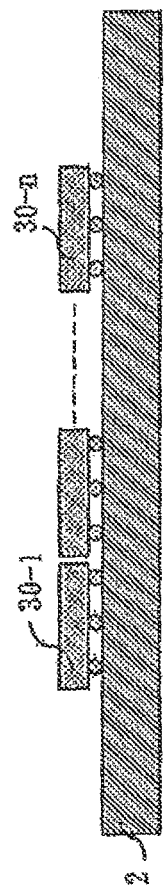
FIG. 2A PRIOR ART
FIG. 2B PRIOR ART

DISPLAY DRIVE CIRCUIT INCLUDING AN OUTPUT TERMINAL

CROSS-REFERENCE TO RELATED APPLICATION

This is the continuation of U.S. application Ser. No. 14/190,495, filed on Feb. 26, 2014, and was allowed on Jul. 31, 2015, which was a divisional of U.S. application Ser. No. 11/907,200, filed on Oct. 10, 2007, now abandoned, the subject matters of which are incorporated herein by reference. These prior US applications and the present continuation application claim the benefit of priority of Japanese Patent Application No. 2006-337902, filed Dec. 15, 2006, the entire disclosure of which is incorporated herein by reference.

BACKGROUND OF THE INVENTION

1. Field of the Invention

The invention relates to a display drive circuit for operating a display device, which uses an organic electroluminescent device (hereinafter called "an organic EL device") or a light emitting diode (hereinafter called "an LED"), and specifically, relates to a display drive circuit formed in a chip manufactured by a Chip On Glass (hereinafter called "a COG") implementation technology, which connects lead lines for a display formed on a glass substrate by bonding.

2. Description of the Related Art

FIG. 2A is a diagram showing the entire skeleton framework of a display panel having an organic EL drive circuit formed on a COG, and FIG. 2B is a sectional view taken on line I1-I2 of FIG. 2A.

The display panel includes a nearly square-shaped glass substrate 2, and a display area 10 displaying the images is located in the center of the substrate 2. In the display area 10, a plurality of data lines SEG and a plurality of scanning lines COM, which are perpendicular to the data lines SEG, are formed. An organic EL device 11 is formed at each intersection of the data lines SEG and the scanning lines COM so that the organic EL devices 11 are arranged in a lattice-like manner. Both of the data lines SEG and the scanning lines COM extend from the display area 10 to an edge of the glass substrate 2 as lead lines. Each of the data lines SEG and the scanning lines COM are formed of a transparent conductive layer using ITO (indium Tin Oxide) for instance. The transparent conductive layer using ITO has a large wiring resistance, compared to that in a wiring layer made of cupper.

A display drive circuit according to the related art includes a plurality of data line drive circuits 20-1 . . . 20-$n$ and a plurality of scanning line drive circuit 30-1 . . . 30-$n$. Each of the data line drive circuits 20-1 . . . 20-$n$ is formed on one of the lead lines of the data lines SEG extending from the display area 10, and is formed in an individual chip, which is implemented by the COG method. Each data line drive circuit 20 includes switching elements such as transistors, which are operated in response to image data for displaying the images, and which have a function to supply a predetermined electric current to each of the data lines SEG. Also provided on each of the lead lines of the scanning lines COM extending from the display area 10 is a respective one of the scanning line drive circuits 30-1 . . . 30-$n$, each formed in an individual chip, which is implemented by the COG method. Each scanning line drive circuit 30 includes switching elements such as transistors, which are operated in response to image data for displaying the images, and which have a function for supplying ground electric potential (ex. 0 volt) to the scanning lines SEG.

The glass substrate is equipped with unillustrated electrical components, such as a control circuit, in an area around the display area 10.

FIG. 3 is a skeletal circuit diagram in an area X of the FIG. 2A, which is adjacent to one of the organic EL devices 11, and in an area Y of the FIG. 2A, which is a part of one of the scanning line drive circuit 30. FIG. 4A is a diagram showing a skeleton framework of one of the scanning line drive circuit 30 shown in FIG. 2A, and FIG. 4B is a sectional view taken on line I21-I22 of FIG. 4A.

As shown in FIG. 2A, the organic EL device is connected in a forward direction between a data line SEG and a scanning line COM that is perpendicular to the data line in the area X.

As shown in FIGS. 2A and 2B and FIGS. 4A and 4B, each of the scanning line drive circuit 30 includes a rectangularly-shaped substrate 31. An elongated ground line 32 having a width W and length L is formed on the substrate 31 along the longer side of the substrate 31. A plurality of output terminals 33-1 . . . 33-$n$ are disposed on the substrate 31 along one of the longer side of the substrate 31, and a plurality of a switches 34-1 . . . 34-$n$, each of which includes a transistor, are formed on the substrate 31 wherein each of the switches 34 is disposed between one of the output terminals 33-1 . . . 33-$n$ and the ground line 32. The switches 34 are operated by the control circuit.

At both ends of the ground line 32, two ground terminals 35-1 and 35-2 are formed near the opposite longer side of the substrate 31. Each output terminal 33 is connected to one of the scanning lines through a bump electrode 36 formed thereon, and each of the two ground terminals is grounded through another bump electrode 36 formed thereon.

One of the organic EL devices 11 (for example the organic EL device 11 illustrated in FIG. 2A) emits light in the following way. Initially, the scanning line drive circuit 30-1, which connects the organic EL device 11 to be eliminated, is connected to the ground line 32 through the output terminal 33-1 and the switch 34-1 so that the ground electric potential (0 volt) is supplied to the scanning line COM connected to the organic EL devices 11. Then, the drive current from the data line drive circuit 20-1 is supplied to the data line SEG, which is connected to the organic EL devices 11. Then, the drive current flows in the flowing order; the data line SEG→the organic EL device 11→the scanning line COM→the output terminal 33-1→switch 34-1→the ground line 32→the ground terminals 34-1 and 34-2. As a result of the flow of the drive current as described above, the organic EL device 11 emits light. The light intensity of the organic EL device 11 depends on the value of the drive current.

Some technologies relating to the display panel having a configuration similar to that described above are disclosed in the following publications.

Reference 1: Japanese laid open patent 2002-151276
Reference 2: Japanese laid open patent 2003-131617
Reference 3: Japanese laid open patent 2004-206056
Reference 4: Japanese laid open patent 2005-144685

According to the reference 1, an EL display device with a good balance between colors of EL elements and with a good balance in emission intensity, which is capable of displaying brightly hued images, is disclosed. According to the reference 2, EL drive circuits, which are similar to the drive circuits of FIGS. 2A, 2B and 3, are disclosed. According to the reference 3, EL drive circuits, which suppress luminance unevenness and retain display quality without enlarging a frame part, are disclosed. Further, the reference 4 discloses line heads of the configuration without any difference in the quantity of light emitted from a plurality of light emitting elements, and an image forming apparatus using the same.

The following problems are recognized in the display drive circuit, for example, the scanning line drive circuits 30, in the related art.

In such a scanning line drive circuits 30, as described above, two ground terminals 34-1 and 34-2 are connected respectively to the opposite ends of the ground line 32, and each ground terminal 34-1 or 34-2, which are implemented by the COG method, is grounded through a respective one of the bump electrodes 36.

Under the COG implementation, not only is high contact resistance created, but also its deterioration is severe. With consideration of the deterioration, the value of the contact resistance varies greatly, such as from few Ω to few tens Ω. The resistance value of the ground line 32 in the scanning line drive circuits 30 is determined by the amount of an electromigration. Thus, in the case that an active matrix organic EL display panel as shown in FIGS. 4A and 4B is driven, it is assumed that the maximum allowable current is required to be 1.0 A of direct current. Here, the electromigration is the phenomenon that occurs when some of the momentum of moving electrons is transferred to nearby-activated ions. This causes the ions to move from their original position.

In the case of the assumption described above, since the maximum allowable current is generally set at 1 mA, the width W of the ground line 32 is required to be a 1000 m when the length L of the ground line 32 is set to be a 10,000 m. Since a sheet resistance is 0.05Ω/□, the resistance value of the ground line 32 having the length L is calculated to be 0.5Ω. As a result, as shown as an arrow in FIG. 4A, the output electric current, which is supplied from the left-end output terminal 33-1 to the ground line 32 through the switch 34-1, may flow to ground through the right-end ground terminal 35-2 in the case that the contact resistance at the ground terminal 35-1 is to be greater than the sum of the resistance value of the ground line 32 and the contact resistance at the ground terminal 35-2.

Further, the dispersion of the contact resistance can be reduced by the size of the ground terminal 35-1 or 35-2. However, if the sizes of the both ground terminals 35-1 and 35-2 are reduced, it would be required to form a hundred ground terminals near each ground terminal 35-1 and 35-2 to obtain the capacity to pass the electric current to ground. As a result, the size of the substrate 31 becomes larger because its longer side is further elongated. This is a distant idea in view of the difficulty of its implementation. Further, the width W of the ground line 32 may need to be a 1000 m so that the shorter side of the substrate 31 is also elongated. As a result, the total side of the scanning line drive circuit becomes larger. This is a specific problem with implementation using the COG method.

This problem cannot be solved by the technology disclosed in the above-described references. For example, according to FIG. 1 of the reference 1, the width of the wiring (107), which connects the two terminals (105) acting as the supply terminals to the current supply lines (104), is set to be a best value wherein two terminals (105) correspond to the ground terminals 35-1 and 35-2 and the current supply lines (104) correspond to the dale lines SEG and the wirings (107) correspond to the ground line 32. If the width W of the ground line 32 is set at the best value by using the technology disclosed in the reference 1, the ground line 32 having a 1000 m width is required as described above. Thus, the shorter side of the substrate 31 is elongated so that the problem is not solved.

According to the reference 3, the width of the power supply line supplying the power supply to the EL display panel is reduced to half so that the area of the flame part can be reduced wherein the area of the flame part corresponds to the area around the display area 10 shown in FIG. 2A. The reason that the width of the power supply line is reduced to half be that the power supply line extends from the mounting terminal area (102) at both of its sides, as shown in FIG. 4 of the reference 3. The technology disclosed in the reference 3 corresponds to the description above in that the width W of the ground line 32 is reduced to half by using two ground terminals 35-1 and 35-2 connected at the both ends of the ground line 32, as shown in FIG. 4A. Thus, the problem is not solved.

The reference 4 does not consider any width of the wiring, and the COG technology is not used. Thus, the teachings of reference 4 cannot be combined with the related arts to solve the problem.

As described above, the problem particularly occurring in the COG technology cannot be solved by the technology disclosed in the above-described references.

SUMMARY OF THE INVENTION

An objective of the invention is to solve the above-described problem and to provide a display drive circuit, whose operation does not depend on the variety of the contact resistance value without making its substrate larger.

The objective is achieved by a display drive circuit formed in a chip manufactured by a chip on glass implementation, which is connected to lead lines formed on a glass substrate, comprising, a rectangularly-shaped substrate, a power supply line formed on the substrate, the line being elongated along the longer side of the rectangularly-shaped substrate, a plurality of output terminals formed on the rectangularly-shaped substrate, the output terminal being disposed along the power supply line, a plurality of bump electrodes, each of which connects one of the output terminal to one of the lead lines, switches disposed along the power supply line, each of which is connected between the one of the output terminals and the power supply line, a single power supply terminal, which is disposed near the middle of the power supply line, being connected to the power supply line.

BRIEF DESCRIPTION OF THE DRAWINGS

The invention will be more particularly described with reference to the accompanying drawings, in which:

FIG. 2A is an entire plan view of a configuration diagram showing a skeleton framework of a display panel having an organic EL drive circuit formed on a COG;

FIG. 2B is a sectional view taken on line I1-I2 of FIG. 2A;

DETAILED DESCRIPTION OF THE PREFERRED EMBODIMENTS

The preferred embodiment of the invention is explained with reference to drawings as follows. In each drawing, the same reference numbers designate the same or similar components.

First Embodiment

Figure 1A:
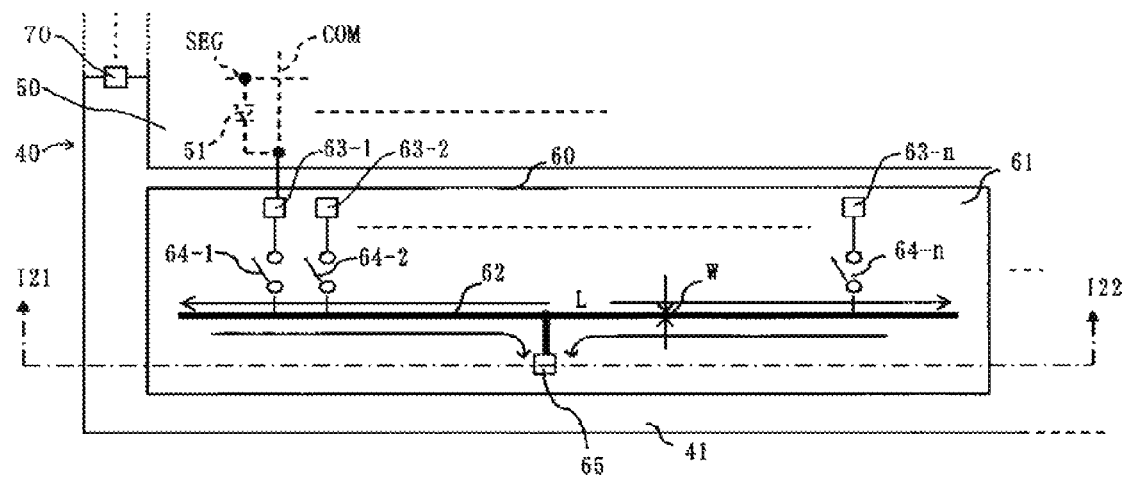
FIG. 1A is a plan view showing a skeleton framework of a display drive circuit, such as a scanning line drive circuit, used in a display panel, according to a first embodiment.
Figure 1B:
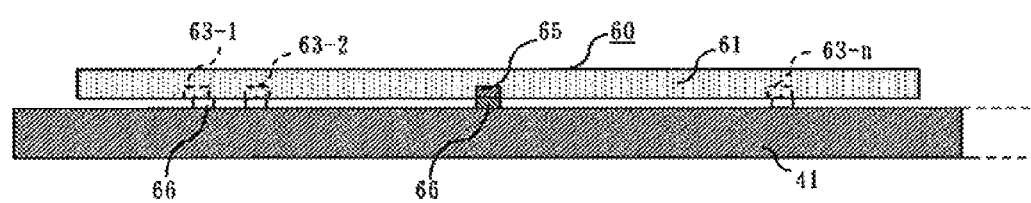
FIG. 1B is a sectional view taken on line I21-I22 of FIG. 1A.
Figure 3:
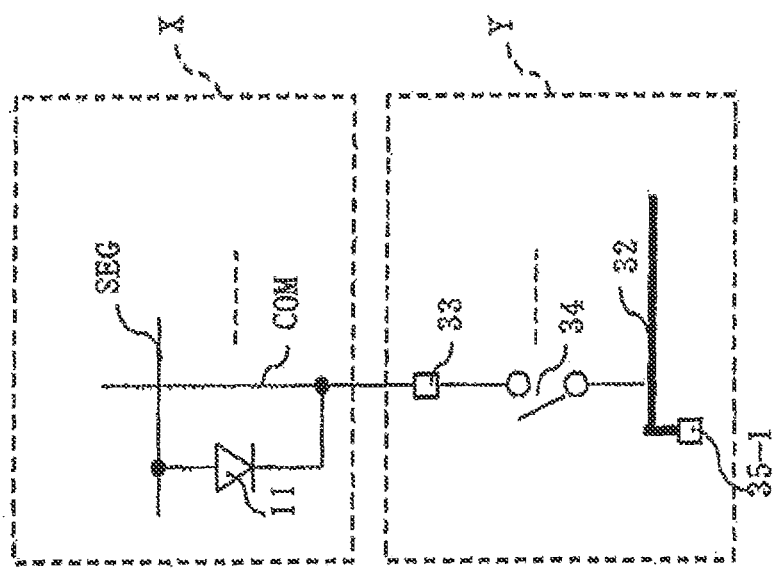
FIG. 3 is a skeletal circuit diagram in an area X of the FIG. 2, which is adjacent to one of the organic EL devices 11 and in an area Y of the FIG. 2, which is a part of one of the scanning line drive circuit 30.

FIG. 1A is a plan view showing a skeleton framework of a display drive circuit, such as a scanning line drive circuit, used in a display panel, according to a first embodiment and FIG. 1B is a sectional view taken on line I21-I22 of FIG. 1A.

As well as the display panel shown in FIGS. 2A and 2B, the display panel 40 includes a nearly square-shaped glass substrate 41, and a display area 50 displaying the images is formed in the center of the substrate 41. In the display area 50, a plurality of data lines SEG and a plurality of scanning lines COM, which are perpendicular to the data lines SEG, are formed. An organic EL device 51 is formed at each intersection of the data lines SEG and the scanning lines COM so that the organic EL devices 51 are arranged in a lattice-like manner. Both of the data lines SEG and the scanning lines COM extend from the display area 50 to an edge of the glass substrate 41 as lead lines. Each of the data lines SEG and the scanning lines COM are formed of a transparent conductive layer using ITO (indium Tin Oxide) for instance. The transparent conductive layer using ITO has large wiring resistance.

A display drive circuit includes a plurality of data line drive circuits 70 and a plurality of scanning line drive circuits 60. Each of the data line drive circuits 70 is formed on one of the lead lines of the data lines SEG extending from the display area 50, and is formed in an individual chip, which is implemented by the COG method. Each data line drive circuit 70 includes switching elements such as transistors, which are operated in response to image data for displaying the images, and which have a function to supply a predetermined electric current to each of the data lines SEG. Also provided on each of the lead lines of the scanning lines COM extending from the display area 50 is a respective one the scanning line drive circuits 60 formed in an individual chip, which is implemented by the COG method. Each scanning line drive circuit 60 includes switching elements such as transistors, which are operated in response to image data for displaying the images, and which have a function for supplying ground electric potential (ex. 0 volt) to the scanning lines SEG.

Each of the scanning line drive circuit 30 includes a rectangularly-shaped substrate 61. An elongated ground line 62 having a predetermined width W and a predetermined length L (ex. 10000 m), and having a resistance value R (ex. 0.5Ω) is extended from one of the shorter side of the substrate 61 to the opposite side on the substrate 61 along one of the longer side of the substrate 61. A plurality of output terminals 63-1 . . . 63-n are disposed regularly on the substrate 31 along another longer side of the substrate 31, and a plurality of a switches 64-1 . . . 64-n, each of which includes a transistor, are formed on the substrate 61 wherein each of the switches 34 is disposed between one of the output terminals 63-1 . . . 33-n and the ground line 62. The switches 34 are operated by an unillustrated control circuit disposed in an area around the display area 50.

A single ground terminals 65 is disposed near the middle location of the another longer side of the substrate 61 between another longer side of the substrate 61 and the ground line 62, and is connected to the ground line near its middle location. Thus, the resistance value of the ground line 62 between the ground terminals 65 and the left end of the ground line 62 is R/2 (about 0.25Ω), and the resistance value of the ground line 62 between the ground terminals 65 and the right end of the ground line 62 is also R/2 (about 0.25Ω). Each output terminal 63 are connected to one of the scanning lines COM through an AU bump electrode 66 formed thereon, and the ground terminals 65 are grounded through another AU bump electrode 66 formed thereon.

The operation of the display drive circuit of the first embodiment is explained below.

One of the organic EL devices 51 (for example the organic EL devices 51 illustrated in FIG. 1A) emits light in the following way. Initially, the scanning line drive circuit 60, which connects the organic EL device 51 to be eliminated, is connected to the ground line 62 through the output terminal 63-1 and the switch 64-1 so that the ground electric potential (0 volt) is supplied to the scanning line COM connected to the organic EL devices 51. Then, the drive current from the data line drive circuit 70 is supplied to the data line SEG, which is connected to the organic EL devices 51. Then, the drive current flows in the flowing order; the data line SEG→the organic EL device 51→the scanning line COM→the output terminal 63-1→switch 64-1→the ground line 64→the single ground terminals 65. As a result of the flow of the drive current described above, the organic EL device 51 emits light. The light intensity of the organic EL device 51 depends on the value of the drive current.

In the case that the switches 64-1 . . . 64-n are turned on by the control circuit in series from the left (64-1) to the right (64-n) illustrated in the FIG. 1A, the drive current from the output terminals 63-1 . . . 63-n/2, which are located in the left side, are flowed to the ground line 62 through the switches 64-1 . . . 64-n/2. Then the drive current flows on the ground line 62 from the left to the center, and then flows to the ground through the single ground terminal 65. On the other hand, the drive current output from the output terminals 63-(n/2+1) . . . 62-n at the right side, flows to the ground line 62 through the switches 64-(n/2+1) . . . 64-n respectively. Then the drive current flows on the ground line 62 from the right to the center, and then flows to the ground through the single ground terminal 65.

Figures 4A, 4B:
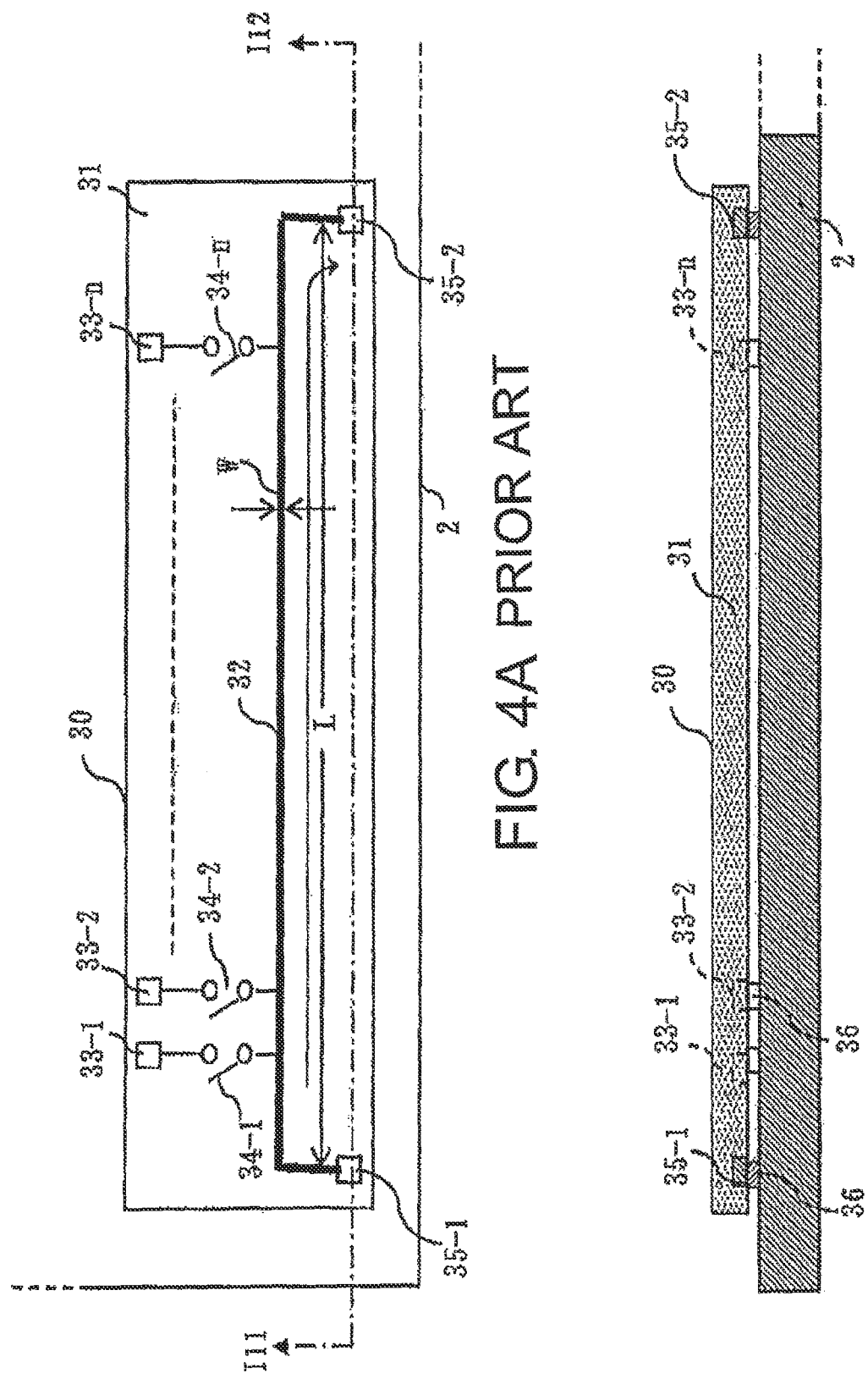
FIG. 4A is a plan view of a configuration diagram showing a skeleton framework of one of the scanning line drive circuit 30 shown in FIG. 2.
FIG. 4B is a sectional view taken on line I21-I22 of FIG. 4A.

As described in the Background of the invention, as well as the scanning line drive circuit 30 shown in FIG. 4, since large contact resistance is formed on the COG implementation, when it is assumed that the maximum allowable current is required to be 1.0 A of direct current, the maximum allowable current is generally at 1 mA. Thus, under this assumption, when the width W of the ground line 62 is set to be a 1000 m and the length L of the ground line 62 is set to be a 10,000 m, the resistance value of the ground line 32 having the length L is calculated 0.5Ω since a sheet resistance is to be 0.05Ω/□.

However, according to the first embodiment of the invention, since the ground terminal 65 is located near the middle of the ground line 62, and is connected to the ground line 62, the drive current, which flows through the switches 64-1 ... 64-n/2 located in the left side, flows on the ground line 62 from its left to its center, and then flows to the ground through the single ground terminal 65 while the drive current, which flows through the switches 64-(n/2+1) ... 64-n/2 located in the right side, flows on the ground line 62 from its right to its center, and then flows to the ground through the single ground terminal 65. In other words, the route of the drive current flowing on the ground line 62 does not depend on the dispersion of the contact resistance, and is always the same. Again, in the scanning line drive circuit in the related art shown in FIGS. 4A and 4B, the route of the drive current flowing on the ground line 62 through the switch 34-1 depends on the contact resistances of the ground terminal, which are determined accidentally in the COG process. In other words, in a certain occasion (if the contact resistance of the ground terminal 35-1 is smaller than the sum of the resistance values of the ground line 32 and the ground terminal 35-2), the drive current reached on the ground line 32 through the switch 34-1 flows to the ground through the ground terminal 35-1. To the contrary, in another certain occasion (if the contact resistance of the ground terminal 35-1 is greater than the sum of the resistance values of the ground line 32 and the ground terminal 35-2), the drive current reached on the ground line 32 through the switch 34-1 flows to the ground through the ground terminal 35-2. However, according to the first embodiment of the invention, the drive current reached on the ground line 62 through the switch 64-1 always flows to the ground through the single ground terminal 65 so that the route of the drive current from a certain switch is always the same. In the first embodiment of the invention, the longest route on the ground line 62 of the drive current is the half of the length of the ground line 62 (L/2). Since the sheet resistance is to be 0.05Ω/☐, the resistance value R of the ground line 32 having the length L/2 is calculated 0.25Ω. As a result, even if the width W of the ground line 62 can be reduced to half, such as at a 500 mm, the electromigration may not occurs. Accordingly, the length of the substrate 61 can be shorter at its shorter side, and the total size of the scanning line drive circuit 60 can be miniaturized.

According to the first embodiment of the invention, at least the following benefit can be expected. Since the single ground terminal 65 is located near the middle of the ground line 62, and is connected to the ground line 62, the length L of the ground line 62 is not changed while the width W of the ground line 62 is reduced to half. As a result, the length of the substrate 61 can be shorter at its shorter side, and the total size of the scanning line drive circuit 60 can be miniaturized.

Second Embodiments

While a single ground terminal 65 is formed in the scanning line drive circuit as shown in FIG. 1A in the first embodiment, a first group of ground terminals are formed near the middle of a ground line in a scanning line drive circuit, a second group of ground terminals are formed at one end of the ground line, and a third group of ground terminals are formed at the other end of the ground line. The second embodiment is explained with reference to FIGS. 5A, 5B and 6.

Figure 5A:
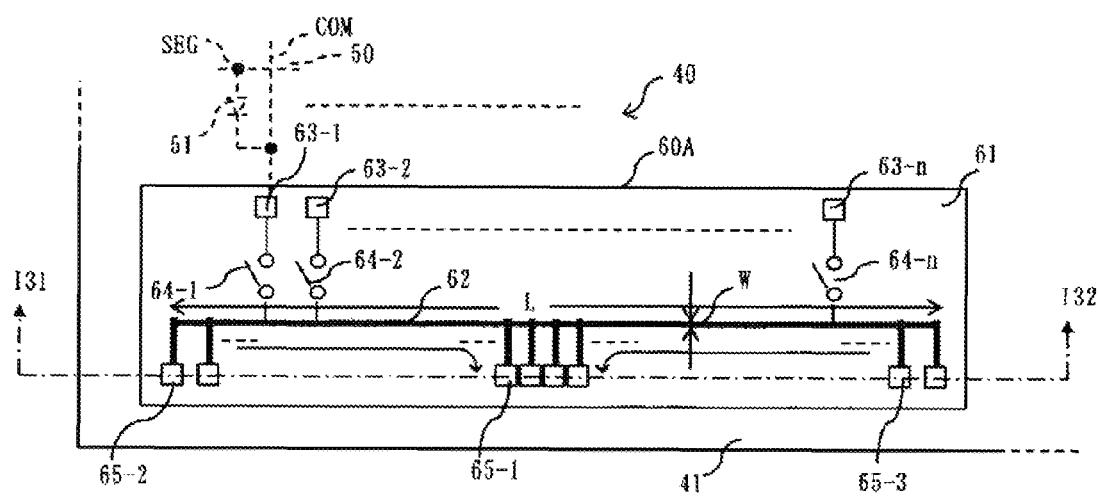
FIG. 5A is a plan view showing a skeleton framework of a display drive circuit, such as a scanning line drive circuit, used in a display panel, according to a second embodiment.
Figure 5B:
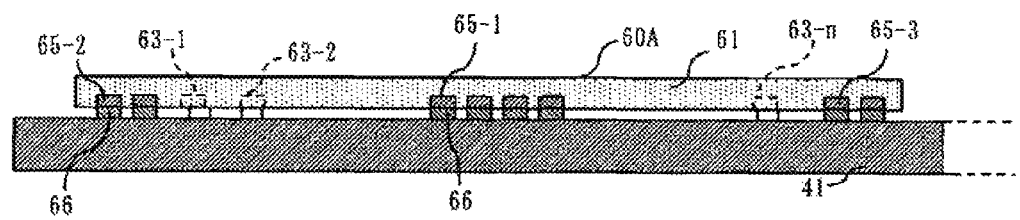
FIG. 5B is a sectional view taken on line I31-I32 of FIG. 5A.
Figure 6:
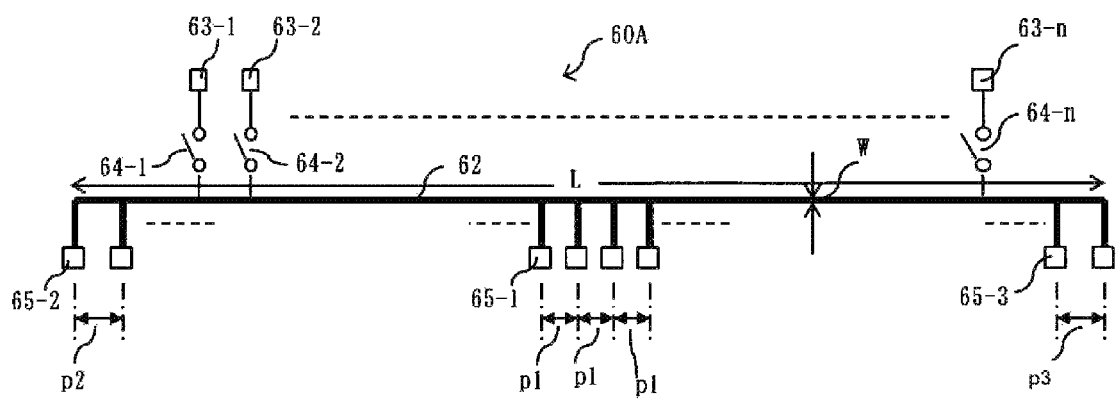
FIG. 6 is an enlarged view showing a layout of the scanning line drive circuit of FIG. 5A.

When the scanning line drive circuits 60 are arranged near the display area 50, as well as the arrangement of the scanning line drive circuits 30-1 ... 30-n shown in FIG. 2, uniformity of displaying the images may occur because of a differences of the power supply impedance, which may be occur between the scanning lines COM, each of which is connected to one adjacent scanning line drive circuits. For example, a differences of the power supply impedance may be occur between the scanning line COM disposed at the most right in the most right side of the scanning line drive circuit in the left and the scanning line COM disposed at the most left in the most left side of the scanning line drive circuit, which is next right to aforementioned scanning line drive circuit, in the right. To eliminate the uniformity of displaying the images occurred at the scanning lines having a difference of the power supply impedance, the scanning line drive circuit according to the second embodiment is composed as follows FIG. 5A is a plan view showing a skeleton framework of a display drive circuit, such as a scanning line drive circuit, used in a display panel, and FIG. 5B is a sectional view taken on line I31-I32 of FIG. 5A. FIG. 6 is an enlarged view showing a layout of the scanning line drive circuit of FIG. 5A. In each drawing and in the FIGS. 1A and 1B, the same reference numbers designate the same or similar components.

As shown in FIG. 5A, a first group of an even number (l) of ground terminals 65-1 is disposed near the middle of a ground line 62 in a scanning line drive circuit 60A, and each of the ground terminals 65-1 of the first group is connected to the ground line 62. A second group of a number (m) of ground terminals 65-2 is disposed at one end of the ground line 62 in the scanning line drive circuit 60A, and each of the ground terminals 65-2 of the second group is connected to the ground line 62. A third group of a number (n) of ground terminals 65-3 is disposed at the other end of the ground line 62 in the scanning line drive circuit 60A, and each of the ground terminals 65-2 of the second group is connected to the ground line 62. The numbers (m) and (n) could be the same, or could be the different. Each of the ground terminals 65-1, 65-2 and 65-2 in the first through third group is grounded through an AU bump electrode 66 formed thereon. Generally, the planar dimension of each ground terminals 65-1, 65-2 and 65-3 is the same.

The number (l) of the ground terminals 65-1 is set to be greater than that (m) of the ground terminals 65-2 or that (n) of the ground terminals 65-2. For this reason, a total of planar dimension of the ground terminals 65-1 of the first group is set to be larger than a total of planar dimension of the ground terminals 65-2 of the second group or a total of planar dimension of the ground terminals 65-3 of the third group. Thus, a sum of the contact resistance of the ground terminals 65-1 of the first group, each of which is connected in parallel, is smaller than that of the ground terminals 65-2, each of which also is connected in parallel or that of the ground terminals 65-3, each of which also is connected in parallel.

Furthermore, as shown in FIG. 6, each of pitches p1 between the ground terminals 65-1 of the first group is set to be greater than each of pitches p2 between the ground terminals 65-2 of the second group or each of the pitches p3 between the ground terminals 65-3 of the third group. The distances of the pitches (p2) and (p3) could be the same, or could be the different.

The operation of the display drive circuit 60A of the second embodiment is explained below. In the case that the switches 64-1 ... 64-n are turned on by the control circuit in series from the left (64-1) to the right (64-n) illustrated in the FIG. 5A, the drive current from the output terminals 63-1 ... 63-$n/2$, which are located in the left side, are flowed to the ground line 62 through the switches 64-1 ... 64-$n/2$. Then a little part of the drive current flows to the ground through the ground terminals 65-2 in the second group, and a large part of the drive current flows on the ground line 62 from the left to the center, and then flows to the ground through the ground terminals 65-1 of the first group, as illustrated by an arrow in FIG. 5A. On the other hand, the drive current output from the output terminals 63-($n/2$+1) ... 63-$n$ at the right side, flows to the ground line 62 through the switches 64-($n/2$+1) ... 64-$n$, respectively. Then a little part of the drive current flows to the ground through the ground terminals 65-3 in the third group, and a large part of the drive current flows on the ground line 62 from the left to the center, and then flows to the ground through the ground terminals 65-1 of the first group, as illustrated by an arrow in FIG. 5A When a contact resistance value of each of the ground terminals 65-1, 65-2 and 65-3 is the same, and is set at the range between 1Ω (min) and 10Ω(max), and when the number (m) of the ground terminals 65-2 is set at twenty (20), the number (n) of the ground terminals 65-3 is also set at twenty (20), and the number (l) of the ground terminals 65-1 is set at forty (40), each sum of the contact resistance of the ground terminals 65-2 and 65-3 of the second and the third groups would be at the range between 0.1Ω (min) and 0.5Ω(max) and the sum of the contact resistance of the ground terminals 65-1 of the first group would be at the range between 0.05Ω (min) and 0.25Ω(max). Thus, seventy percent (70%) of the drive current flows to the ground through the ground terminals 65-1, and the rest (30%) of the drive current flows to the ground through either of the ground terminals 65-2 or 65-3.

According to the second embodiment of the invention, since a plurality of the ground terminals 65-2 and 65-3 are formed at the both ends of the ground line 62 in addition to a plurality of the ground terminals 65-1 near the middle of the ground line 62, it could be reduce the differences of the power supply impedance, which may occur between the scanning lines COM, each of which is connected to one adjacent scanning line drive circuits. Accordingly the uniformity of displaying the images at the scanning lines having a difference of the power supply impedance can be eliminated.

Furthermore, since a sum of the contact resistance of the ground terminals 65-1 of the first group is smaller than that of both the ground terminals 65-2 and the ground terminals 65-3, it could cause a large part of the drive current to flow to the ground through the ground terminals 65-1 located near the middle of the ground line 62 so that almost the same benefit performed in the first embodiment can be expected.

Moreover, since each of the pitches p1 between the ground terminals 65-1 of the first group is set to be greater than each of the pitches p2 between the ground terminals 65-2 of the second group or each of the pitches p3 between the ground terminals 65-3 of the third group, degree of density of the ground terminals 65-1 is higher than that of the ground terminals 65-2 or that of the ground terminals 65-3. Thus, the length of the scanning line drive circuit 60A at its longer side can be suppressed to become further longer. Furthermore, in the second embodiment of the invention, since the size of the ground terminals 65-1, 65-2 and 65-3 are the same, a plurality of the ground terminals 65-1 in the first group is formed in order to excess the number (m) or (n) of the ground terminals 65-2 and 65-3. However, a single ground terminal having a planar dimension, which is larger than the total planar dimension of either the ground terminals 65-2 or 65-3, may be disposed near the middle of the ground line, and connects thereto.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them. For example, in the display area 50 of the display panel 40 in the FIG. 50, another circuit consignation can be employed. In the embodiments, although the organic EL devices are used, other display devices, such as a light emitting diode (LED) can be employed to both embodiments. Further, the number (l) of the ground terminals 65-1 and the numbers (m) and (n) of the ground terminals 65-2 and 65-3 may be set as a desired ratio. Moreover, in the embodiments, although the scanning line drive circuits 60 and 60A are explained for the sake of brevity, both embodiments can be applied to another display drive circuit, such as the data line drive circuit 70. For example, the ground line 62 can be replaced with the power supply line, the switches 64 can be replace with other switches, each having a different configuration, and the ground terminal 65 can be replaced with an power supply terminal.

Various other modifications of the illustrated embodiment will be apparent to those skilled in the art on reference to this description. Therefore, the appended claims are intended to cover any such modifications or embodiments as fall within the true scope of the invention.

What is claimed is:

1. A display system, comprising:
    a display panel for displaying an image, the display panel including a glass substrate;
    a plurality of lead lines formed on the glass substrate; and
    a display drive circuit for controlling the displaying of the image by the display panel, the display drive circuit being formed as a chip and connected to the lead lines, the display drive circuit comprising:
        a rectangularly-shaped substrate having a main surface and having a longer side that is longer than another side of the rectangularly-shaped substrate;
        a power supply line formed on the main surface of the rectangularly-shaped substrate, the power supply line being disposed along the longer side of the rectangularly-shaped substrate;
        a plurality of output terminals formed on the main surface of the rectangularly-shaped substrate and connected to the power supply line between an end portion of the power supply line and a center portion of the power supply line;
        first ground terminals formed at the end portion of the power supply line; and
        second ground terminals formed at the center portion of the power supply line.

2. A display system as claimed in claim 1, the display drive circuit further comprising a plurality of switches disposed along the power supply line, and connected to the power supply line,
    wherein the plurality of output terminals are connected to the plurality of switches.

3. A display system as claimed in claim 2, wherein an amount of a current flowing in the power supply line to the first ground terminals is smaller than an amount of a current flowing in the power supply line to the second ground terminals.

4. A display system as claimed in claim 1, wherein the power supply line is a ground line supplying a ground electric potential, and wherein each of the first and second ground terminals supplies the ground electric potential.

5. A display system as claimed in claim 1, wherein a ratio of a length of the power supply line to a width of the power supply line is 20:1.

6. A display system as claimed in claim 1,
wherein each of the first and second ground terminals has a same size, and
wherein a number of the second ground terminals is greater than that of the first ground terminals.

7. A display system, comprising:
a display panel for displaying an image, the display panel including a glass substrate;
a plurality of lead lines formed on the glass substrate; and
a display drive circuit for controlling the displaying of the image by the display panel, the display drive circuit being formed as a chip and connected to the lead lines, the display drive circuit comprising:
  a rectangularly-shaped substrate having a main surface and having a longer side that is longer than another side of the rectangularly-shaped substrate;
  a power supply line formed on the main surface of the rectangularly-shaped substrate, the power supply line being disposed along the longer side of the rectangularly-shaped substrate;
  first ground terminals formed at an end portion of the power supply line; and
  second ground terminals formed at a center portion of the power supply line,
wherein a size of each terminal of the second ground terminals is the same as that of each terminal of the first ground terminals, and
wherein a number of power supply terminals of the second ground terminals is greater than that of the first ground terminals.

8. A display system, comprising:
a display panel for displaying an image, the display panel including a glass substrate;
a plurality of lead lines formed on the glass substrate; and
a display drive circuit for controlling the displaying of the image by the display panel, the display drive circuit being formed as a chip and connected to the lead lines, the display drive circuit comprising:
  a rectangularly-shaped substrate having a main surface and having a longer side that is longer than another side of the rectangularly-shaped substrate;
  a power supply line formed on the main surface of the rectangularly-shaped substrate, the power supply line being disposed along the longer side of the rectangularly-shaped substrate;
  first ground terminals formed at an end portion of the power supply line; and
  second ground terminals formed at a center portion of the power supply line,
wherein each pitch between terminals of the second ground terminals is greater than that of the first ground terminals.

9. A display system, comprising:
a display panel for displaying an image, the display panel including a glass substrate;
a plurality of lead lines formed on the glass substrate; and
a display drive circuit for controlling the displaying of the image by the display panel, the display drive circuit being formed as a chip and connected to the lead lines, the display drive circuit comprising:
  a rectangularly-shaped substrate having a main surface and having a longer side that is longer than another side of the rectangularly-shaped substrate;
  a power supply line formed on the main surface of the rectangularly-shaped substrate, the power supply line being disposed along the longer side of the rectangularly-shaped substrate;
  first ground terminals formed at an end portion of the power supply line; and
  second ground terminals formed at a center portion of the power supply line,
wherein a total planar dimension of the second ground terminals is set to be larger than a total planar dimension of the first ground terminals.

10. A display system, comprising:
a display panel for displaying an image, the display panel including a glass substrate;
a plurality of lead lines formed on the glass substrate; and
a display drive circuit for controlling the displaying of the image by the display panel, the display drive circuit being formed as a chip and connected to the lead lines, the display drive circuit comprising:
  a rectangularly-shaped substrate having a main surface and having a longer side that is longer than another side of the rectangularly-shaped substrate;
  a power supply line formed on the main surface of the rectangularly-shaped substrate, the power supply line being disposed along the longer side of the rectangularly-shaped substrate;
  first ground terminals formed at an end portion of the power supply line; and
  second ground terminals formed at a center portion of the power supply line,
wherein each of pitches between terminals of the second ground terminals is set to be greater than each of pitches between terminals of the first ground terminals.

11. A display driver circuit, comprising:
a rectangular-shaped substrate having a main surface and having a longer side that is longer than another side of the rectangular-shaped substrate;
a power supply line formed on the main surface of the rectangular-shaped substrate, the power supply line being disposed along the longer side of the rectangular-shaped substrate;
a plurality of output terminals formed on the main surface of the rectangular-shaped substrate and connected to the power supply line between an end portion of the power supply line and a center portion of the power supply line;
first ground terminals formed on the main surface of the rectangular-shaped substrate and connected to the end portion of the power supply line; and
second ground terminals formed on the main surface of the rectangular-shaped substrate and connected to the center portion of the power supply line.

12. A display driver circuit as claimed in claim 11, further comprising a plurality of switches disposed along the power supply line, and connected to the power supply line,
wherein the plurality of output terminals are connected to the plurality of switches.

13. A display driver circuit as claimed in claim 12, wherein an amount of a current flowing in the power supply line to the first ground terminals is smaller than an amount of a current flowing in the power supply line to the second ground terminals.

14. A display driver circuit as claimed in claim 12,
wherein each of the first and second ground terminals has a same size, and
wherein a number of the second ground terminals is greater than that of the first ground terminals.

15. A display driver circuit as claimed in claim 11, wherein a total planar dimension of the second ground terminals is set to be larger than a total planar dimension of the first ground terminals.

16. A display system, comprising:
a display panel for displaying an image, the display panel including a glass substrate;
a plurality of lead lines formed on the glass substrate; and
a display drive circuit for controlling the displaying of the image by the display panel, the display drive circuit being formed as a chip and connected to the lead lines, the display drive circuit comprising:
a rectangularly-shaped substrate having a main surface and having first and second longer sides that are both longer than other sides of the rectangularly-shaped substrate;
a power supply line formed on the main surface of the rectangularly-shaped substrate, the power supply line being disposed along the first longer side of the rectangularly-shaped substrate;
output terminals formed on the main surface of the rectangularly-shaped substrate, disposed along the first longer side, and arranged between the first longer side and the power supply line;
first ground terminals formed at an end portion of the power supply line and arranged between the second longer side and the power supply line; and
second ground terminals formed at a center portion of the power supply line and arranged between the second longer side and the power supply line.

17. A display driver circuit, comprising:
a rectangularly-shaped substrate having a main surface and having first and second longer sides that are both longer than other sides of the rectangularly-shaped substrate;
a power supply line formed on the main surface of the rectangularly-shaped substrate, the power supply line being disposed along the first longer side of the rectangularly-shaped substrate;
output terminals formed on the main surface of the rectangularly-shaped substrate, disposed along the first longer side, and arranged between the first longer side and the power supply line;
first ground terminals formed at an end portion of the power supply line and arranged between the second longer side and the power supply line; and
second ground terminals formed at a center portion of the power supply line and arranged between the second longer side and the power supply line.

\* \* \* \* \*